United States Patent
Turner et al.

(10) Patent No.: US 8,232,819 B2
(45) Date of Patent: Jul. 31, 2012

(54) CLOSED-LOOP SOFT ERROR RATE SENSITIVITY CONTROL

(75) Inventors: Mark F. Turner, Longmont, CO (US); Jeffrey S. Brown, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 372 days.

(21) Appl. No.: 12/629,816

(22) Filed: Dec. 2, 2009

(65) Prior Publication Data

US 2011/0128035 A1      Jun. 2, 2011

(51) Int. Cl.
*H03K 19/003* (2006.01)
(52) U.S. Cl. .................. 326/9; 326/14; 326/15; 326/33
(58) Field of Classification Search .................. None
See application file for complete search history.

(56) References Cited

U.S. PATENT DOCUMENTS 5,331,164 A      7/1994 Buehler et al.
7,859,292 B1 *   12/2010 Shuler, Jr. ....................... 326/11
8,031,549 B2 *   10/2011 Kenkare et al. ............... 365/226
2005/0223251 A1* 10/2005 Liepe et al. .................... 713/322
2007/0211527 A1  9/2007 Hsu et al.

FOREIGN PATENT DOCUMENTS

JP       57 098186       6/1982

OTHER PUBLICATIONS

European Search Report, mailed Jun. 25, 2010, in EPO Application No. 10154624.0-1233.

* cited by examiner

*Primary Examiner* — Anh Tran
(74) *Attorney, Agent, or Firm* — Alexander J. Neudeck; Cochran Freund & Young LLC

(57) ABSTRACT

Disclosed is a closed-loop feedback system for controlling the soft error rate (SER) due to radiation strikes on electronic circuitry. A variable sensitivity soft error rate detector provides and output corresponding to the soft error rate. This output is supplied to a voltage control. The output of the voltage control is fed back to the sensitivity control of the sensor—thus forming a feedback loop. The output of the voltage control may be the power supply of the soft error rate sensor. The output of the soft error rate sensor may also be used to enable and disable fault tolerant schemes or alert a user.

20 Claims, 7 Drawing Sheets

```
┌─────────────────────────────┐
│   APPLY AN INPUT SUPPLY     │
│ VOLTAGE TO AN SER SENSOR    │
│       AND A SYSTEM          │
│            502              │
└─────────────────────────────┘
              │
              ▼
┌─────────────────────────────┐
│   ADJUST INPUT SUPPLY       │
│   VOLTAGE BASED ON A        │
│  CHANGED OUTPUT OF THE      │
│        SER SENSOR           │
│            504              │
└─────────────────────────────┘
              │
              ▼
┌─────────────────────────────┐
│  TURN ON SYSTEM FAULT       │
│ TOLERENCE SCHEME WHEN       │
│  THE OUTPUT OF THE SER      │
│ SENSOR MEETS A CRITERIA     │
│            506              │
└─────────────────────────────┘
```

FIGURE 5

CLOSED-LOOP SOFT ERROR RATE SENSITIVITY CONTROL

BACKGROUND OF THE INVENTION

Modern digital integrated circuits can have internal logic disturbed by radiation in the form of alpha-particle or neutron strikes. A disruption is called a Single Event Upset (SEU). When SEUs occur in storage elements, such as memories, latches, flip-flops, and charge coupled devices, they are persistent. This persistence is particularly troublesome. The rate at which SEUs occur is called the Soft Error Rate (SER). Persistent SEUs in control logic, or state-machines, can lead a circuit into an unwanted state. This can lead to a system failure.

Radiation (e.g., alpha particle and neutron particle) flux changes with the physical environment and location. For example, cosmic radiation levels are correlated with altitude and thus can change significantly on airplane flights. In another example, free neutrons tend to follow the magnetic poles. Thus, neutron flux can vary significantly across the world. Thus, the SER also varies with the physical environment and location of the system or integrated circuit.

SUMMARY OF THE INVENTION

An embodiment of the invention may therefore comprise an apparatus, comprising: a soft error rate monitor that produces an indication of a soft error rate occurring in a sensor, said sensor receiving a supply voltage that affects said soft error rate occurring in said sensor; and, a supply voltage control that receives said indication of said soft error rate and sets said supply voltage, said supply voltage control setting said supply voltage to satisfy a criteria soft error rate occurring in said sensor.

An embodiment of the invention may therefore further comprise a method of operating an electronic device, comprising: receiving an indicator of a soft error rate from a sensor, a sensitivity of said sensor being based on an input voltage; and, adjusting said input voltage to change said sensitivity of said sensor in response to changes in said indicator of said soft error rate from said sensor.

An embodiment of the invention may therefore further comprise an apparatus, comprising: a soft error rate sensor, a sensitivity of said soft error rate sensor being based on an input voltage; a voltage regulator that determines said input voltage based on an output of said soft error rate sensor; and, system circuitry receiving a supply voltage corresponding to said input voltage, a system sensitivity to soft errors being based on said supply voltage.

BRIEF DESCRIPTION OF THE DRAWINGS

FIG. 5 is a flowchart of a method of controlling soft errors.

DETAILED DESCRIPTION OF THE EMBODIMENTS

Figure 1:
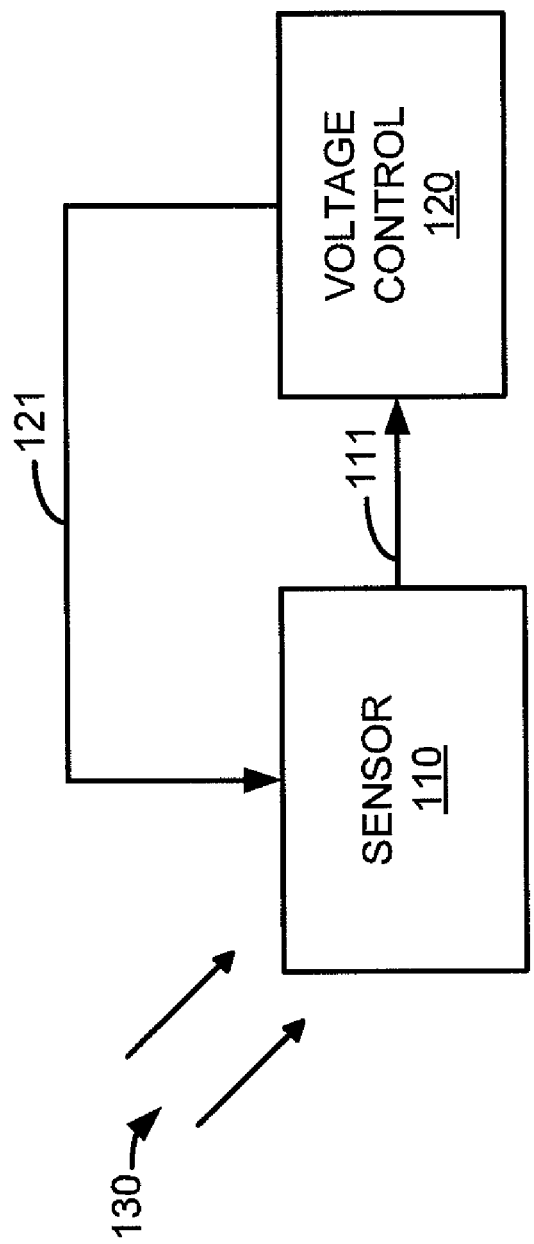
FIG. 1 is a block diagram of a closed-loop soft error sensitivity control system.

FIG. 1 is a block diagram of a closed-loop soft error sensitivity control system. In FIG. 1, soft error sensitivity control system 100 comprises: soft error sensor 110 and voltage control 120. Sensor 110 outputs a soft error rate indicator 111 that is coupled to voltage control 120. Based on the soft error rate indicator 111, voltage control 120 produces a control voltage 121 that is input to sensor 110. Control voltage 121 affects the sensitivity of sensor 110 to radiation 130 impinging on sensor 110. Thus, the sensor 110, soft error rate indicator 111, voltage control 120, and control voltage 121 form a closed-loop feedback system that adjusts control voltage 121 to sensor 110 such that the soft error rate indicator 111 maintains roughly constant level over varying amounts of impinging radiation 130. In an embodiment, voltage control 120 may adjust control voltage 121 to maintain the soft error rate indicator 111 at or below a threshold level.

In an embodiment, control voltage 121 is a power supply voltage to radiation sensitive circuitry in sensor 110. The radiation sensitive circuitry in sensor 110 becomes less sensitive to radiation 130 strikes as control voltage 121 is raised. For example, a range of ±5% around a nominal power supply voltage to sensor 110 can change the sensitivity of sensor 110 over a range of 2:1. When radiation 130 levels are low, voltage control 120 outputs a lower control voltage 121 to sensor 110. This makes sensor 110 more sensitive to radiation 130. Equilibrium is reached whereby voltage control 120 (via control voltage 121) maintains soft error rate indicator 111 at roughly a constant value. In another embodiment, equilibrium is reached when voltage control 120 maintains soft error rate indicator at or below a threshold level.

In an embodiment, soft error rate indicator 111 corresponds to a rate of soft errors occurring in sensor 110. Thus, maintaining soft error rate indicator 111 at the constant value corresponds to maintaining the rate of soft errors occurring in sensor 110 at a nearly constant value. Likewise, maintain soft error rate indicator 111 at or below a threshold level corresponds to maintaining the rate of soft errors occurring in sensor 110 at or below a threshold level.

In an embodiment, control voltage 121 may be used to control the soft error rate of other circuitry. For example, control voltage 121 may be used to set a system power supply level. Thus, when sensor 110 is receiving high levels of radiation 130, the system power supply level is raised in order to make that system circuitry less sensitive to radiation strikes.

Figure 2:
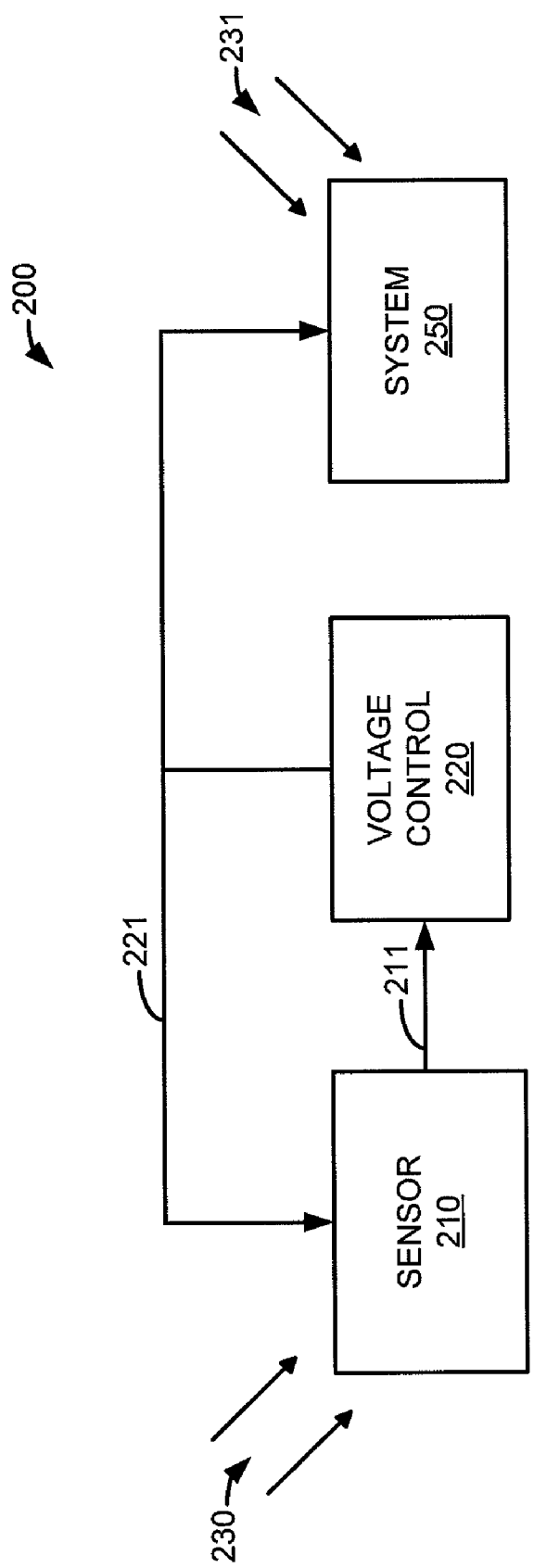
FIG. 2 is a block diagram soft error sensitivity control system.

FIG. 2 is a block diagram soft error sensitivity control system. In FIG. 2, soft error sensitivity control system 200 comprises sensor 210, voltage control 220, and system 250. As discussed previously, sensor 210, soft error rate indicator 211, voltage control 220, and control voltage 221 form a closed-loop feedback system that adjusts control voltage 221 to sensor 210 such that the soft error rate indicator 211 maintains a roughly constant level over varying amounts of impinging radiation 230. Thus, the sensitivity of sensor 210 is manipulated in order to keep the rate of soft errors occurring in sensor 210 at (or below) a constant (or threshold) value.

In FIG. 2, system 250 also receives control voltage 221. The sensitivity of system 250 to radiation 231 is affected by control voltage 221. In an embodiment, the sensitivity of system 250 to radiation 231 for a particular control voltage 221 level corresponds to the sensitivity of sensor 210 to radiation 230. Thus, the soft error rate occurring in system 250 corresponds (or varies together with) the soft error rate occurring in sensor 210. Assuming radiation 230 and radiation 231 track each other proportionally (i.e., when radiation 230 doubles, radiation 231 also doubles), controlling the sensitivity of system 250 to radiation 231 with control voltage 221 can result in a constant soft error rate occurring in system 250. This constant soft error rate in system 250 is maintained in spite of changes in the level of radiation 231 striking system 250. Thus, a stable (or below a threshold) level of soft errors can be maintained in system 250 over a range of radiation 231 levels striking system 250. In an embodiment, control voltage 221 is a power supply voltage.

Figure 3:
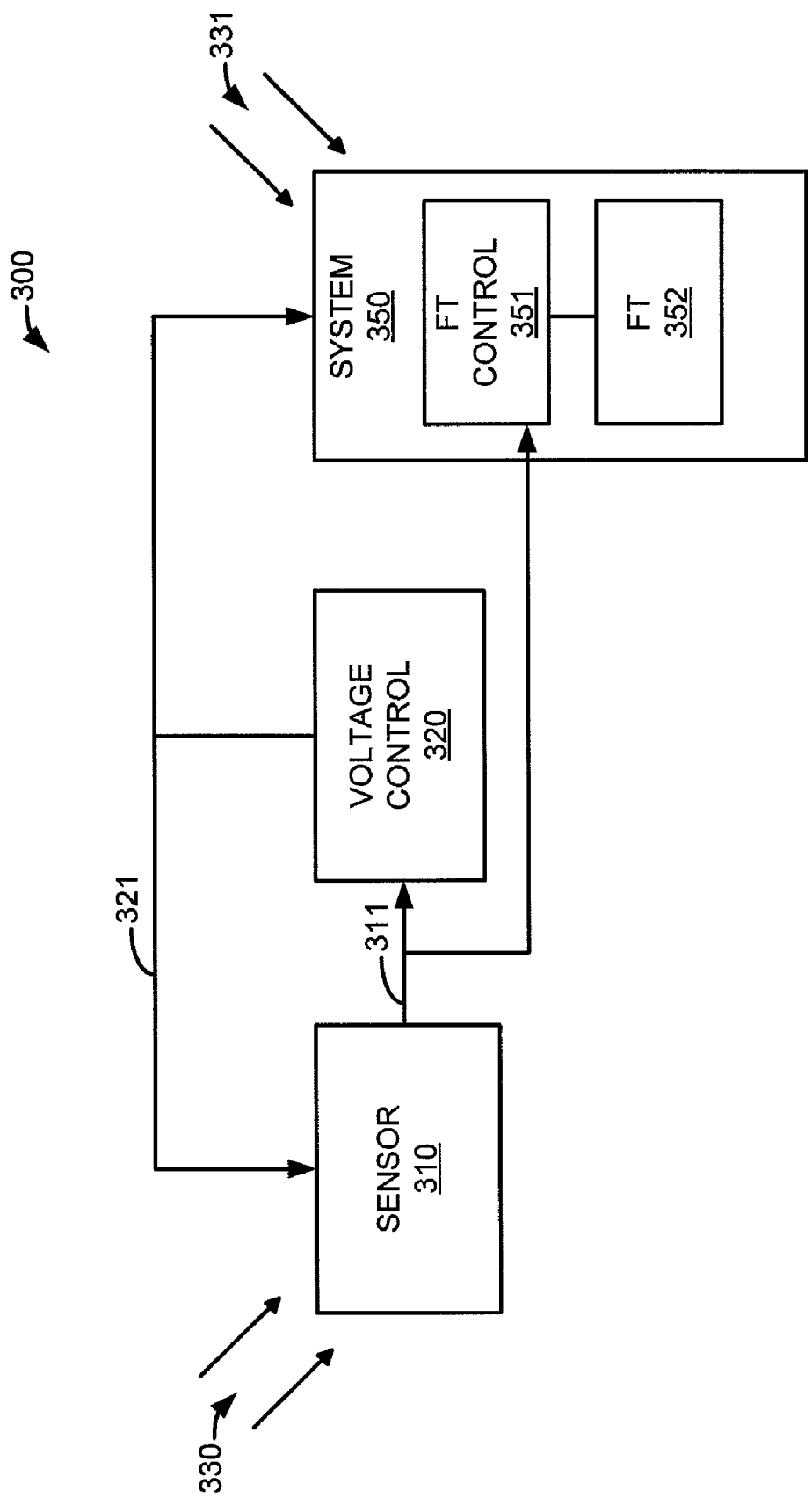
FIG. 3 is a block diagram of a soft error control system.

FIG. 3 is a block diagram of a soft error control system. In FIG. 3, soft error sensitivity control system 300 comprises sensor 310, voltage control 320, and system 350. As discussed previously, sensor 310, soft error rate indicator 311, voltage control 320, and control voltage 321 form a closed-loop feedback system that adjusts control voltage 321 to sensor 310 such that the soft error rate indicator 311 maintains roughly constant level over varying amounts of impinging radiation 330. Thus, the sensitivity of sensor 310 is manipulated in order to keep the rate of soft errors occurring in sensor 310 from radiation 330 and system 350 from radiation 331 at (or below) a constant (or threshold) rate. In an embodiment, control voltage 331 is a power supply voltage.

In FIG. 3, system 350 includes fault tolerant (FT) control 351 and fault tolerant block 352. Fault tolerant control 351 is coupled to fault tolerant block 352. Fault tolerant control 351 receives soft error rate indicator 311. Based on soft error rate indicator 311, fault tolerant control 351 may enable (or turn on) a fault tolerant scheme that uses fault tolerant block 352. For example, if the closed-loop feedback system is unable to maintain the soft error rate inside of system 350 at or below a threshold level, then fault tolerant control 351 may respond by enabling system 350 to use a fault tolerant scheme to protect against soft errors caused by radiation 331. Examples of fault tolerant schemes that fault tolerant control 351 may enable to protect against soft errors caused by radiation 331 include, but are not limited to: parity algorithms to detect errors; error correcting codes to protect data; redundant circuits; redundant circuits and a voting scheme; and, fault tolerant or fault correcting software algorithms run by system 350.

Finally, if soft error rate indicator 311 exceeds a second threshold, system 350 may shut down or alert a user that the system is being operated out of specification and should not be used. This information may be communicated to the user via an error message or some other type of indicator (e.g., error light).

It should be understood that the aforementioned systems adapt to meet a desired (or required) soft error rate level by using a soft error rate monitor (a.k.a. soft error rate sensor), or other radiation flux sensor, to control hardware and/or software that affects the soft error rate of a system (or chip). In an embodiment, the soft error rate feedback system can be entirely on one integrated circuit. In another embodiment, one or more parts of the feedback system (or the controlled system) may be on another chip. For example, the control voltage produced by the feedback system may be used by an off-chip system power supply to adjust the power supply to the integrated circuit. In this manner, the voltage control (e.g., 120, 220, and 320) is off-chip, while the rest of the system (e.g., sensor 210 and system 250) are on the same chip. In another example, the sensor may be on a separate integrated circuit from the other components of the system.

Figure 4:
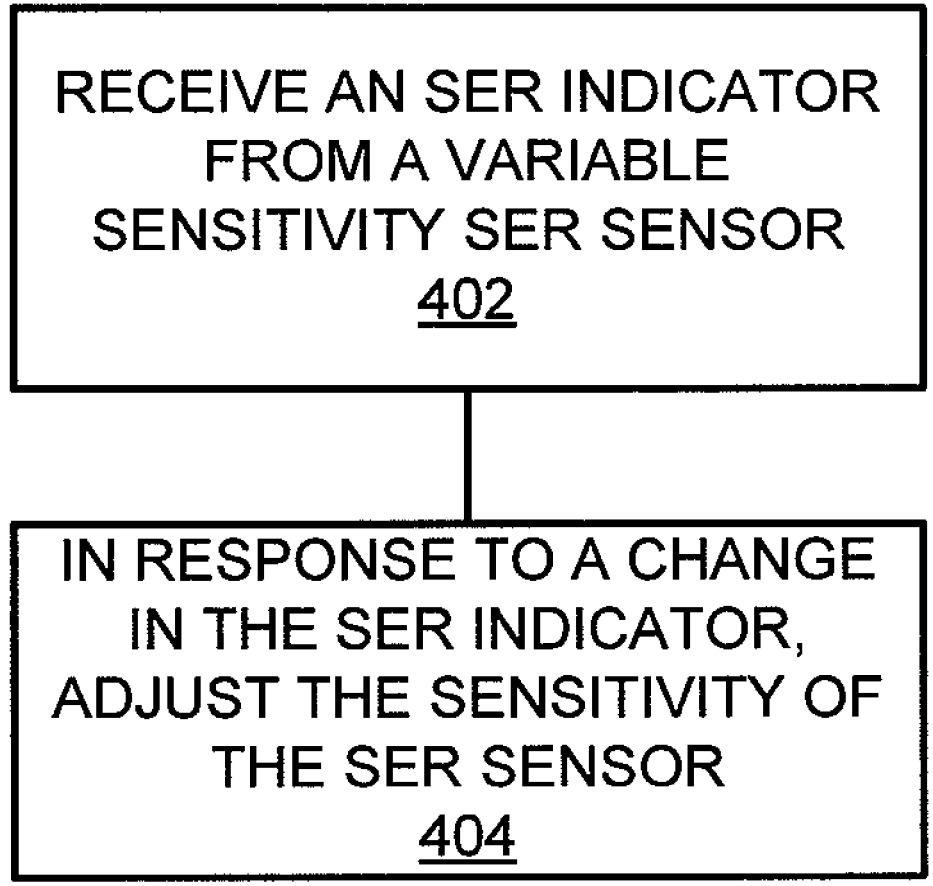
FIG. 4 is a flowchart of a method of operating an electronic device.

FIG. 4 is a flowchart of a method of operating an electronic device. The steps shown in FIG. 4 may be performed by one or more elements of systems 100, 200, or 300. A soft error rate indicator is receive from a variable sensitivity soft error rate sensor (402). For example, voltage control 120 may receive soft error rate indicator 111 from sensor 110. The sensitivity of sensor 110 to impinging radiation 130 varies based on control voltage 121.

In response to a change in the soft error rate indicator, the sensitivity of the soft error rate sensor is adjusted (404). For example, in response to a change in soft error rate indicator 111 from sensor 110, voltage control 120 adjusts the sensitivity of sensor 110 to impinging radiation 130 by adjusting control voltage 121.

FIG. 5 is a flowchart of a method of controlling soft errors. The steps shown in FIG. 5 may be performed by one or more elements of system 300. An input supply voltage is applied to a soft error rate sensor and a system (502). For example, control voltage 321 may be (or control) a power supply voltage used by sensor 310 and system 350. The input supply voltage is adjusted based on a changed output of the soft error rate sensor (504). For example, control voltage 321 (or the power supply voltage it controls) may be adjusted by voltage control 320 in response to a change in the output of sensor 310 (soft error rate indicator 311).

A system fault tolerance scheme is turned on when the output of the soft error rate sensor meets a criteria (506). For example, fault tolerance control 351 may turn on fault tolerance 352 in response to soft error rate indicator 311 exceeding a threshold. Fault tolerance control 351 may turn on a hardware or software based fault tolerance scheme 352. When soft error rate indicator 311 falls back below the threshold, fault tolerance control 351 may turn off a hardware or software based fault tolerance scheme 352. Fault tolerance schemes that fault tolerance control 351 may turn on include, but are not limited to: parity algorithms to detect errors; error correcting codes to protect data; redundant circuits; redundant circuits and voting schemes, and fault tolerant or fault correcting software algorithms.

Figure 6:
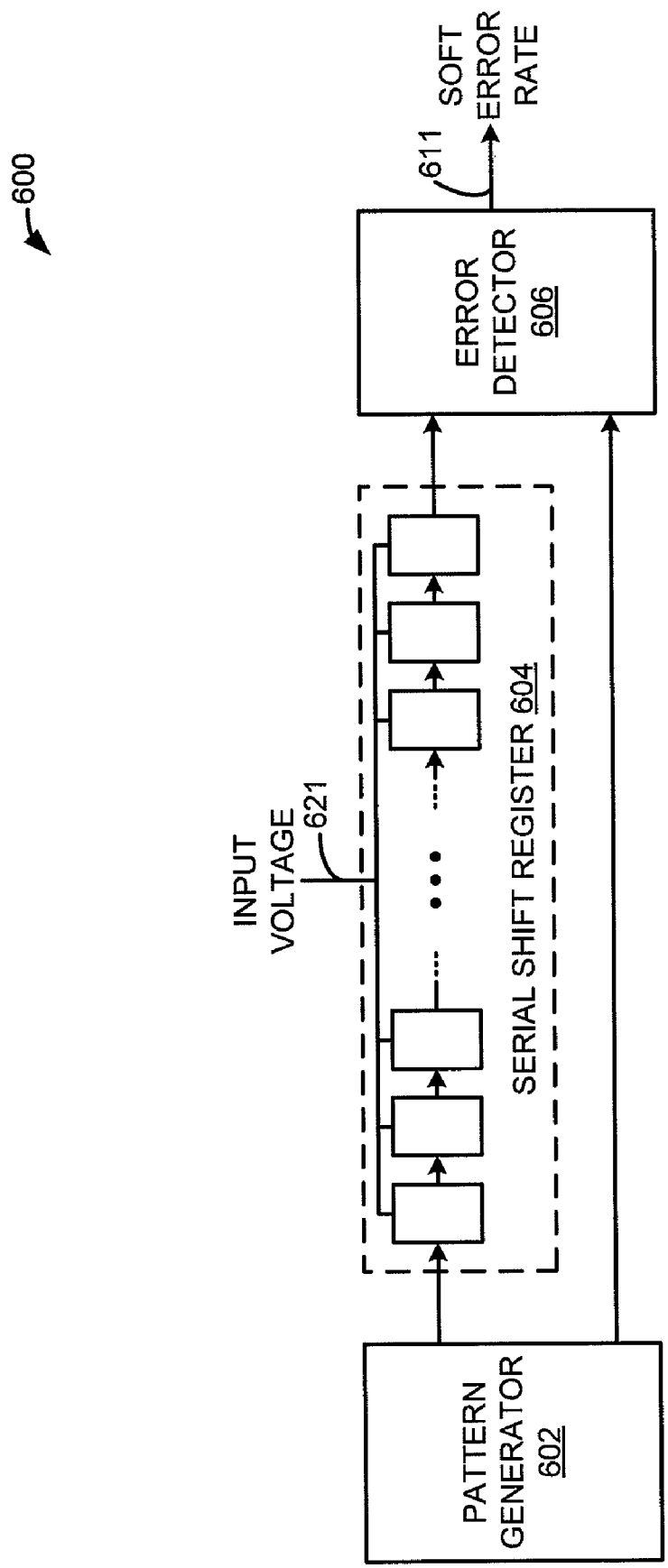
FIG. 6 is a block diagram of a soft error rate sensor.

FIG. 6 is a block diagram of a soft error rate sensor. Soft error rate sensor 600 shown in FIG. 6 is an example SER sensor that may be used as any of sensors 110, 210, or 310. SER sensor 600 performs what is referred to as the Circuit for Radiation Effects Self-Test (CREST) algorithm. SER sensor 600 comprises pattern generator 602, serial shift register 604, and error detector 611. Serial shift register 604 is, in general, the circuit that is being tested for soft errors (and thus a soft error rate). Serial shift register has an integer multiple of N stages (i.e., N*M stages where N and M are integers). The sensitivity of each of these stages to radiation is affected by input voltage 621. In an embodiment, input voltage 621 is the power supply voltage to the stages of serial shift register 604.

Pattern generator 602 outputs a repeating data pattern. The repeating data pattern repeats itself every N shift cycles of serial shift register 604. The input of serial shift register 604 receives the repeating data pattern from pattern generator 602. Error detector 606 receives the output of serial shift register 604. Error detector 606 also receives the repeating data pattern from pattern generator 602. Because serial shift register 604 is an integer multiple (M) of the length of the repeating data pattern (i.e., N), if no soft errors occur in serial shift register 604, the data patterns received at the two inputs to error detector 606 will match. However, if one or more bits of the repeating data pattern are changed by a radiation strike, error detector 606 will detect this as a difference between its two inputs. Thus, error detector 606 can generate an indicator of the soft error rate 611.

In an embodiment, pattern generator 602 may be a simple flip-flop that toggles an output (e.g., 10101010). In another embodiment, pattern generator 602 may implement a linear feedback shift register to produce a more complex repeating pattern. Error detector 606 can be a simple comparator (e.g., XOR gate) and a counter. In an embodiment, pattern generator 602 and/or error detector 606 may be constructed to be less sensitive than serial shift register 604 to radiation strikes.

The methods, systems, devices, and functions described above may be implemented with or executed by one or more computer systems. The methods described above may also be stored on a computer readable medium. Some or all of the elements of control system 100, soft error sensitivity control system 200, and soft error sensitivity control system 300, may be, comprise, or be included in computers systems, integrated circuits, systems on a chip (SoC), or their components. This includes, but is not limited to control system 100, soft error sensor 110, voltage control 120, soft error sensitivity control system 200, sensor 210, voltage control 220, system 250, soft error sensitivity control system 300, sensor 310, voltage control 320, and system 350.

Figure 7:
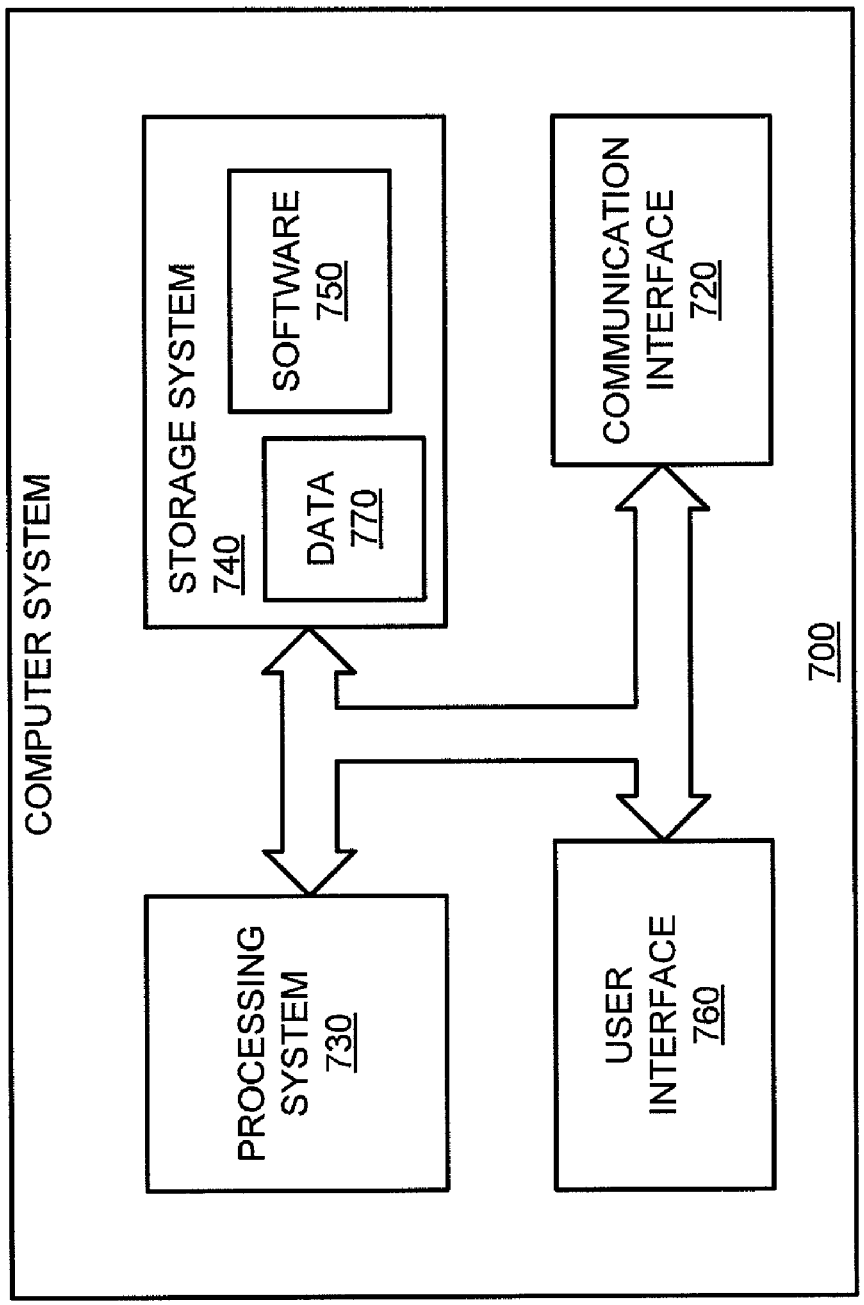
FIG. 7 is a block diagram of a computer system.

FIG. 7 illustrates a block diagram of a computer system. Computer system 700 includes communication interface 720, processing system 730, storage system 740, and user interface 760. Processing system 730 is operatively coupled to storage system 740. Storage system 740 stores software 750 and data 770. Processing system 730 is operatively coupled to communication interface 720 and user interface 760. Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. User interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, network storage, server, or other memory function. Storage system 740 may be a computer readable medium. Storage system 740 may be distributed among multiple memory devices.

Processing system 730 retrieves and executes software 750 from storage system 740. Processing system may retrieve and store data 770. Processing system may also retrieve and store data via communication interface 720. Processing system 750 may create or modify software 750 or data 770 to achieve a tangible result. Processing system may control communication interface 720 or user interface 770 to achieve a tangible result. Processing system may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate as described herein.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An apparatus, comprising:
a soft error rate monitor that produces an indication of a soft error rate occurring in a variable sensitivity soft error sensor, said variable sensitivity soft error sensor receiving a supply voltage that affects said soft error rate occurring in said sensor; and,
a supply voltage control that receives said indication of said soft error rate and sets said supply voltage, said supply voltage control setting said supply voltage to satisfy a criteria soft error rate occurring in said variable sensitivity soft error sensor.

2. The apparatus of claim 1, further comprising:
system circuitry, said system circuitry receiving said supply voltage.

3. The apparatus of claim 2, wherein said sensor and said system circuitry are on the same integrated circuit.

4. The apparatus of claim 2, further comprising:
a control that is responsive to said indication of said soft error rate, said control directing a first part of said system circuitry to implement a fault tolerant scheme.

5. The apparatus of claim 4, wherein said fault tolerant scheme comprises using an error correcting code (ECC).

6. The apparatus of claim 4, wherein said fault tolerant scheme comprises using redundant circuitry.

7. The apparatus of claim 6, wherein said fault tolerant scheme comprises a logic voting scheme.

8. The apparatus of claim 1, further comprising:
a computer system, a component of said computer system having a component supply voltage based on said supply voltage.

9. A method of operating an electronic device, comprising:
receiving an indicator of a soft error rate from a variable sensitivity soft error sensor, a sensitivity of said variable sensitivity soft error sensor being based on an input voltage; and,
adjusting said input voltage to change said sensitivity of said variable sensitivity soft error sensor in response to changes in said indicator of said soft error rate from said sensor.

10. The method of claim 9, wherein said input voltage is adjusted to decrease said sensitivity of said variable sensitivity soft error sensor in response to said indicator of said soft error rate indicating an increase in said soft error rate.

11. The method of claim 9, wherein said input voltage corresponds to a supply voltage supplied to system circuitry.

12. The method of claim 11, further comprising:
causing a fault tolerance scheme in said system circuitry to be used.

13. The method of claim 12, wherein said fault tolerance scheme includes at least one of an error correcting code, parity, and redundant logic.

14. An apparatus, comprising:
a variable sensitivity soft error rate sensor, a sensitivity of said variable sensitivity soft error rate sensor being based on an input voltage;
a voltage regulator that determines said input voltage based on an output of said variable sensitivity soft error rate sensor; and, system circuitry receiving a supply voltage corresponding to said input voltage, a system sensitivity to soft errors being based on said supply voltage.

15. The apparatus of claim 14, comprising:
fault tolerant circuitry responsive to said output of said variable sensitivity soft error rate sensor.

16. The apparatus of claim 15, wherein said fault tolerant circuitry is responsive to software control.

17. The apparatus of claim 15, wherein said variable sensitivity soft error rate sensor and said system circuitry are on said same integrated circuit.

18. The apparatus of claim 15, wherein said fault tolerant circuitry and said system circuitry are on said same integrated circuit.

19. The apparatus of claim 18, wherein said fault tolerant circuitry includes redundant circuitry implemented a voting scheme.

20. The apparatus of claim 18, wherein said fault tolerant circuitry turns on an error correcting code data protection scheme.

* * * * *